(12) United States Patent
Jewell-Larsen

(10) Patent No.: US 8,508,908 B2
(45) Date of Patent: Aug. 13, 2013

(54) ELECTROHYDRODYNAMIC (EHD) FLUID MOVER WITH FIELD SHAPING FEATURE AT LEADING EDGE OF COLLECTOR ELECTRODES

(75) Inventor: Nels Jewell-Larsen, San Jose, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 13/310,676

(22) Filed: Dec. 2, 2011

(65) Prior Publication Data

US 2012/0268857 A1 Oct. 25, 2012

Related U.S. Application Data

(63) Continuation-in-part of application No. 13/105,343, filed on May 11, 2011.

(60) Provisional application No. 61/478,312, filed on Apr. 22, 2011, provisional application No. 61/510,596, filed on Jul. 22, 2011.

(51) Int. Cl.
*H02H 1/00* (2006.01)
(52) U.S. Cl.
USPC .......................................... 361/231; 361/212
(58) Field of Classification Search
USPC .................. 361/212, 220, 230, 231
See application file for complete search history.

(56) References Cited

U.S. PATENT DOCUMENTS

| 4,380,720 | A  | * | 4/1983 | Fleck ..................... 315/111.91 |
| 6,504,308 | B1 |   | 1/2003 | Krichtafovitch et al. |
| 6,919,698 | B2 |   | 7/2005 | Krichtafovitch |
| 7,157,704 | B2 |   | 1/2007 | Krichtafovitch et al. |
| 7,911,146 | B2 | * | 3/2011 | Dunn-Rankin et al. . 315/111.91 |
| 2010/0155025 | A1 |   | 6/2010 | Jewell-Larsen et al. |
| 2011/0292560 | A1 |   | 12/2011 | Jewell-Larsen et al. |

OTHER PUBLICATIONS

Jewell-Larsen. "Modeling of corona-induced electrohydrodynamic flow with COMSOL multiphysics." Proc. ESA Annual Meeting on Electrostatics 2008, Paper E1. pp. 1-13.

* cited by examiner

*Primary Examiner* — Danny Nguyen

(57) ABSTRACT

Small form-factor ion flow fluid movers that provide electrostatically operative surfaces in a flow channel adjacent to an emitter electrode, but upstream of a collector electrode or electrodes, can shape operative electric fields and influence ion flows in ways that accentuate downstream flow while minimizing upstream ion migration. In some cases, dielectric surfaces (or even electrically isolated conductive surfaces) along a flow channel adjacent to an emitter electrode can be configured to collect and retain an initial population of generated ions and thereafter electrostatically repel further ions. Depending on the configuration of such dielectric or electrically isolated conductive surfaces, these repelling electrostatic forces may dissuade ion migration or flow from sensitive but closely proximate components and/or may shape fields to enhance ion flows in a desired downstream direction.

28 Claims, 11 Drawing Sheets

ELECTROHYDRODYNAMIC (EHD) FLUID MOVER WITH FIELD SHAPING FEATURE AT LEADING EDGE OF COLLECTOR ELECTRODES

CROSS-REFERENCE TO RELATED APPLICATION(S)

The present application is a continuation-in-part of application Ser. No. 13/105,343, filed May 11, 2011, which in turn claims priority of Provisional Application No. 61/478,312, filed Apr. 22, 2011. The present application also claims priority of Provisional Application No. 61/510,596, filed Jul. 22, 2011. Each of the foregoing applications is incorporated herein in its entirety by reference.

BACKGROUND

1. Field

The present application relates to devices that generate ions and electrical fields to motivate flow of fluids, such as air, and more particularly, to small form-factor, electrohydrodynamic (EHD) air movers suitable for use as part of a thermal management solution to dissipate heat.

2. Related Art

Devices built to exploit ionic movement of a fluid are variously referred to in the literature as ionic wind machines, electric wind machines, corona wind pumps, electro-fluid-dynamic (EFD) devices, electrohydrodynamic (EHD) thrusters, EHD gas pumps and EHD fluid or air movers. Some aspects of the technology have also been exploited in devices referred to as electrostatic air cleaners or electrostatic precipitators.

When employed as part of a thermal management solution, an ion flow fluid mover may result in improved cooling efficiency with reduced vibrations, power consumption, electronic device temperatures and/or noise generation. These attributes may reduce overall lifetime costs, device size or volume, and in some cases may improve system performance or user experience.

As electronic device designers drive to smaller and smaller form-factors, such as in ultra-thin laptop computers, flat panel displays or all-in-one computers and handheld devices such as popularized by iPhone™ and iPad™ devices available from Apple, Inc., packing densities of components and subsystems create significant thermal management challenges. In some cases, active strategies to exhaust heat to the ambient environment may be required. In some cases, mass transport across a ventilation boundary may be unnecessary, but heat transport within the device may be necessary or desirable to reduce hotspots.

Ion flow fluid movers present an attractive technology component of thermal management solutions. Solutions are desired that allow ion flow fluid movers to be integrated in thin and/or densely packed electronic devices, often in volumes that provide as little as 2-3 mm of clearance in a critical dimension. In particular, solutions are desired that allow dense packing of high-voltage, ion-flux generating EHD components in close proximity to electronic assemblies and in ways that advantageously shape electric fields and ion flows.

SUMMARY

It has been discovered that small form-factor ion flow fluid movers that provide electrostatically operative surfaces in a flow channel adjacent to an emitter electrode, but upstream of a collector electrode or electrodes, can shape operative electric fields and influence ion flows in ways that accentuate downstream flow while minimizing upstream ion migration. In some cases, dielectric surfaces (or even electrically isolated conductive surfaces) along a flow channel adjacent to an emitter electrode can be configured to collect and retain an initial population of generated ions and thereafter electrostatically repel further ions. Depending on the configuration of such dielectric or electrically isolated conductive surfaces, these repelling electrostatic forces may dissuade ion migration or flow from sensitive but closely proximate components and/or may shape fields to enhance ion flows in a desired downstream direction.

Unfortunately, it may be difficult (and indeed, in small form-factor designs, undesirable) to maintain significant standoff distances between downstream collector electrodes and such dielectric or electrically isolated conductive surfaces. Accordingly, electrostatic discharge or arcing may be a problem as accumulated charge seeks an electrically attractive path to ground (or other electrical potential). In general, electrostatic discharge or arcing is undesirable in electrohydrodynamic devices because it tends to generate ozone and, in some cases, can pit or otherwise damage electrode surfaces that should preferably present a smooth surface contour and generally uniform electrical potential. Electrostatic discharge or arcing may also damage coatings or surface treatments that are provided to limit build-up of detrimental materials (silica, dust, etc.) on collector electrodes, to improve collector electrode robustness to frictional cleaning and/or to manage conductivity or other electrical characteristics of a collector electrode surface. In some cases, discharge or arcing may result in undesirable acoustic energy.

Accordingly, techniques have been developed to shape electrical fields proximate to leading (upstream) edges of collector electrodes and thereby avoid or at least limit electrostatic discharge or arcing between such collector electrodes and immediately adjacent portions of dielectric or electrically isolated conductive surfaces that accumulate charge during operation of an electrohydrodynamic (EHD) fluid mover. In some cases, the techniques involve structural features of electrostatically operative surfaces immediately adjacent a collector electrode or to other surfaces upon which an ion flow impinges. In some cases, the techniques involve material characteristics of electrostatically operative surfaces that, immediately adjacent to a collector electrode, transition to a material composition that is conductive but generally resistive to current flow.

In some embodiments in accordance with the present invention, an electrohydrodynamic (EHD) fluid mover apparatus is energizable to motivate fluid flow and includes an elongate emitter electrode and a pair of collector electrodes. The elongate emitter electrode is positioned in a channel at least partially defined by generally opposing surfaces that span at least a substantial portion of a longitudinal extent of the emitter electrode and that extend generally upstream thereof. The collector electrodes each span at least a substantial portion of a longitudinal extent of the emitter electrode and each have a leading edge relative to the fluid flow. The leading edges are positioned downstream of the emitter electrode but each proximate to a respective one of the generally opposing surfaces. The generally opposing surfaces are each formed of material suitable for accumulating, over a substantial portion thereof, electrostatic charge conveyed from the emitter electrode and each include a field shaping feature proximate to the leading edges of the respective collector electrode.

In some embodiments, each collector electrode of the pair is positioned against and in contact with a respective one of the generally opposing surfaces, and the field shaping feature includes a trench formed in a respective one of the generally opposing surface at a position that coincides with the leading edge of the respective collector electrode, defining an air gap between the leading edge and material of the generally opposing surface. In some cases, each collector electrode of the pair exhibits an elongate shape extending downstream along a respective one of the generally opposing surfaces. In some cases, the generally opposing surfaces are each formed of dielectric material. In some cases, the generally opposing surfaces are each faced with one or more segments of conductive material electrically isolated from each other and from signal or power conveying conduction paths and ground. In some cases, the generally opposing surfaces are each faced dielectric tape or film.

In some embodiments, the apparatus further includes berms each formed in or on a respective one of the generally opposing surfaces at a position just upstream of the leading edge of the respective collector electrode.

In some embodiments, the field shaping feature includes a berm formed on a respective one of the generally opposing surfaces at a position just upstream of, and extending along the substantial entirety of, the leading edge of the respective collector electrode. In some cases, the berm intrudes into the channel and facilitates localized charge accumulation that, during operation of the EHD fluid mover, diverts ion current around a portion of the generally opposing surface most closely proximate the leading edge of a respective collector electrode. In some cases, the berm is formed of, or faced with dielectric material or conductive material electrically isolated from signal or power conveying conduction paths and ground.

In some embodiments, the field shaping feature includes a trench formed in a respective one of the generally opposing surface at a position that coincides with the leading edge of the respective collector electrode and extends along the respective generally opposing surface at least as far upstream as the elongate emitter electrode.

In some embodiments, additional collector electrodes are positioned, together with the pair of collector electrodes, to define an array thereof extending generally across the channel from one of the generally opposing surfaces to the other. In some cases, the field shaping feature includes a trench formed in a respective one of the generally opposing surfaces that provides an air gap between a particular collector electrode of the pair most closely proximate the respective generally opposing surface. In some cases, the defined array is a generally linear array. In some cases, the defined array presents a generally concave profile to ion flux from the elongate emitter electrode.

In some embodiments, the field shaping feature includes a material transition wherein material immediately proximate to the leading edge of a respective collector electrode is conductive but generally resistive to current flow. In some cases, the collector electrodes and the generally resistive transition material are coupled to a same or substantially equivalent power supply voltage terminal, and resistance along a path from the generally resistive transition material to the same or substantially similar power supply voltage terminal substantially exceeds that from the collector electrodes. In some cases, electrical characteristics of the transition material vary in the dimension of the fluid flow. In some cases, the transition material presents a generally less resistive conductive path proximate the leading edges of the respective collector electrodes and presents a generally more resistive conductive path at increasing upstream distance from the leading edges of the respective collector electrodes.

In some embodiments in accordance with the present invention, a method of operating electrohydrodynamic (EHD) fluid mover apparatus includes energizing an elongate emitter electrode to motivate fluid flow. The elongate emitter electrode is positioned upstream of a pair of collector electrodes in a channel at least partially defined by generally opposing surfaces that span at least a substantial portion of a longitudinal extent of the emitter electrode and that extend at least from the collector electrodes generally upstream thereof past the elongate emitter electrode. The method further includes accumulating over a substantial portion of the generally opposing surfaces electrostatic charge conveyed from the emitter electrode and shaping electric field proximate to leading edges of the respective collector electrode using at least a portion of the accumulated electrostatic charge.

In some embodiments, the method further includes accumulating a localized concentration of the electrostatic charge at a berm formed in a respective one of the opposing surfaces. The electric field shaping diverts ion flow away from a portion of the respective opposing surface most closely proximate a respective collector electrode of the pair.

In some embodiments, the method further includes distributing ion flux from the elongate emitter wire over an array of collector electrodes including the pair, the array positioned to extend generally across the channel from one of the generally opposing surfaces to the other.

In some embodiments in accordance with the present invention, a method of making an electronic device product with an electrohydrodynamic (EHD) air mover to motivate airflow therethrough includes forming generally opposing surfaces of material suitable for accumulating, over a substantial portion thereof, electrostatic charge conveyed from an elongate emitter electrode and positioning the emitter electrode in a channel at least partially defined by the generally opposing surfaces. The generally opposing surfaces span least a substantial portion of a longitudinal extent of the emitter electrode and extend generally upstream thereof. The method further includes positioning a pair of collector electrodes, each spanning at least a substantial portion of a longitudinal extent of the emitter electrode and each having a leading edge relative to the fluid flow, the leading edges positioned downstream of the emitter electrode but each proximate to a respective one of the generally opposing surfaces. The formed generally opposing surfaces each include a field shaping feature formed therein or thereon proximate to the leading edges of the respective collector electrode. In some cases, the material suitable for accumulating electrostatic charge is a dielectric material, and the field shaping feature is formed of the dielectric material.

In some embodiments, the method includes facing the generally opposing surfaces with one or more segments of conductive material electrically isolated from each other and from signal or power conveying conduction paths and ground. In some embodiments, the method includes facing the generally opposing surfaces with dielectric film or tape.

In some cases, the forming includes forming a berm-type field shaping feature in or on the generally opposing surfaces. In some cases, the forming includes forming a trench-type field shaping feature in or on the generally opposing surfaces. These and other embodiments will be understood with reference to the description herein, the drawings and the appended claims.

BRIEF DESCRIPTION OF THE DRAWINGS

The present invention may be better understood, and its numerous objects, features, and advantages made apparent to those skilled in the art by referencing the accompanying drawings.

FIG. 13B depicts an illustrative partial interior cross-section view in which an EHD air mover akin to that illustrated in FIG. 3 is integrated within a body portion of the laptop-style, consumer electronics device. FIG. 13C depicts, in a further illustrative cross-section, device configurations in which an EHD air mover akin to that illustrated in FIG. 11 is part of a device stack that includes circuit board-type electronic assembly.

The use of the same reference symbols in different drawings indicates similar or identical items.

DESCRIPTION OF THE PREFERRED EMBODIMENT(S)

Figure 1:
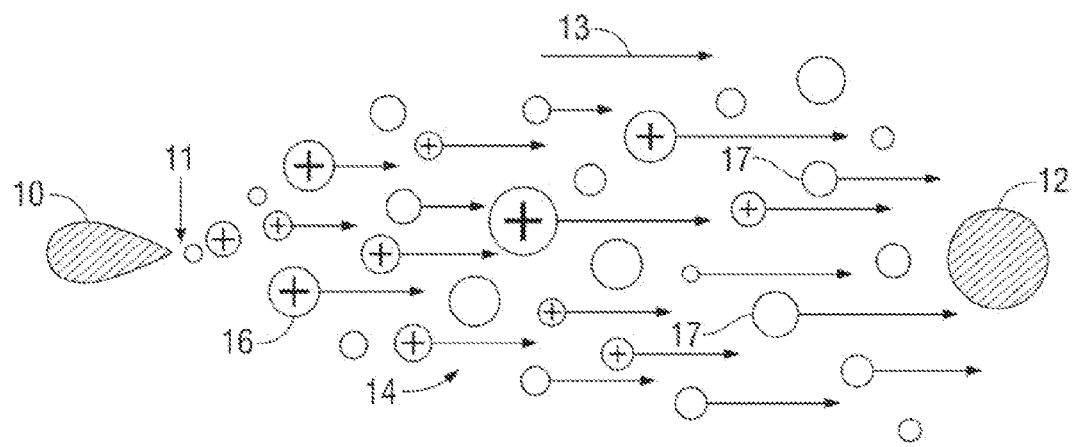
FIG. 1 is a graphic depiction of certain basic principles of electrohydrodynamic (EHD) fluid flow in a corona discharge type device.

As will be appreciated, many of the designs and techniques described herein have particular applicability to the thermal management challenges of densely-packed devices and small form-factors typical of modern consumer electronics. Indeed, some of the EHD fluid/air mover designs and techniques described herein facilitate active thermal management in electronics whose thinness or industrial design precludes or limits the viability of mechanical air movers such as fans, blowers, etc. In some embodiments, such EHD fluid/air movers may be fully integrated in an operational system such as a pad-type or laptop computer, a projector or video display device, a set-top box, etc. In other embodiments, such EHD fluid/air movers may take the form of subassemblies or enclosures adapted for use in providing such systems with EHD motivated flows.

In general, a variety of scales, geometries and other design variations are envisioned for electrostatically operative surfaces that provide field shaping or that functionally constitute a collector electrode, together with a variety of positional interrelationships between such electrostatically operative surfaces and the emitter and/or collector electrodes of a given EHD device. For purposes of illustration, we focus on certain exemplary embodiments and certain surface profiles and positional interrelationships with other components. For example, in much of the description herein, generally planar collector electrodes are formed as or on respective parallel surfaces that define opposing walls of a fluid flow channel and which are positioned proximate to a corona discharge-type emitter wire that is displaced (upstream) from leading portions of the respective collector electrodes. Nonetheless, other embodiments may employ other configurations or other ion generation techniques and will nonetheless be understood in the descriptive context provided herein.

In the present application, some aspects of embodiments illustrated and described herein are referred to as electrohydrodynamic fluid accelerator devices, also referred to as "EHD devices," "EHD fluid accelerators," "EHD fluid movers," "ion fluid movers" and the like. For purposes of illustration, some embodiments are described relative to particular EHD device configurations in which a corona discharge at, or proximate to, an emitter electrode operates to generate ions that are accelerated in the presence of an electrical field, thereby motivating fluid flow. While corona discharge-type devices provide a useful descriptive context, it will be understood (based on the present description) that other ion generation techniques may also be employed. For example, in some embodiments, techniques such as silent discharge, AC discharge, dielectric barrier discharge (DBD), or the like, may be used to generate ions that are in turn accelerated in the presence of an electrical field and motivate fluid flow.

Using heat transfer surfaces that, in some embodiments, take the form of heat transfer fins, heat dissipated by electronics (e.g., microprocessors, graphics units, etc.) and/or other components can be transferred to the EHD motivated fluid flow and exhausted from an enclosure through a ventilation boundary. Typically, when a thermal management system is integrated into an operational environment, heat transfer paths (often implemented as heat pipes or using other technologies) are provided to transfer heat from where it is dissipated (or generated) to a location (or locations) within the enclosure where air flow motivated by an EHD device (or devices) flows over heat transfer surfaces.

For illustration, heat transfer fins are depicted with respect to various exemplary embodiments. However, as will be appreciated based on the description herein, in some embodiments, conventional arrays of heat sink fins need not be provided and EHD motivated fluid flow over exposed interior surfaces, whether proximate a heat generating device (such as a processor, memory, RF section, optoelectronics or illumination source) or removed therefrom, may provide sufficient heat transfer. In each case, provision of ozone catalytic or reactive surfaces/materials on heat transfer surfaces may be desirable. Typically, heat transfer surfaces, field shaping surfaces and dominant ion collecting surfaces of a collector electrode present differing design challenges and, relative to some embodiments, may be provided using different structures or with different surface conditioning. However, in some embodiments, a single structure may be both electrostatically operative (e.g., to shape fields or collect ions) and provide heat transfer into an EHD motivated fluid flow.

Note that, in some unventilated embodiments, EHD motivated fluid flow may be circulated within an enclosure, which in turn, may radiatively or convectively transfer heat from exposed surfaces to the ambient environment. In this way, hotspots on the exterior surface of the enclosure can be eliminated or at least mitigated even without significant airflow through a ventilation boundary. Of course, in some embodiments, EHD motivated flow(s) may be employed both to manage localized hotspots and to exhaust heat by forced convective heat transfer to an air flow that transits a ventilation boundary.

Electrohydrodynamic (EHD) Fluid Acceleration, Generally

Basic principles of electrohydrodynamic (EHD) fluid flow are well understood in the art and, in this regard, an article by Jewell-Larsen, N. et al., entitled "Modeling of corona-induced electrohydrodynamic flow with COMSOL multiphysics" (in the *Proceedings of the ESA Annual Meeting on Electrostatics* 2008) (hereafter, "the Jewell-Larsen Modeling article"), provides a useful summary. Likewise, U.S. Pat. No. 6,504,308, filed Oct. 14, 1999, naming Krichtafovitch et al. and entitled "Electrostatic Fluid Accelerator" describes certain electrode and high voltage power supply configurations useful in some EHD devices. U.S. Pat. No. 6,504,308, together with sections I (Introduction), II (Background), and III (Numerical Modeling) of the Jewell-Larsen Modeling article are hereby incorporated by reference herein for all that they teach.

Summarizing briefly with reference to the illustration in FIG. 1, EHD principles include applying a high intensity electric field between a first electrode 10 (often termed the "corona electrode," the "corona discharge electrode," the "emitter electrode" or just the "emitter") and a second electrode 12. Fluid molecules, such as surrounding air molecules, near the emitter discharge region 11 become ionized and form a stream 14 of ions 16 that accelerate in the electric field toward second electrode 12, colliding with neutral fluid molecules 17 in the process. As a result of these collisions, momentum is transferred from the stream 14 of ions 16 to the fluid molecules 17, imparting corresponding movement of the fluid molecules 17 in a desired fluid flow direction, denoted by arrow 13, toward second electrode 12. Second electrode 12 may be variously referred to as the "accelerating," "attracting," "target" or "collector" electrode. While stream 14 of ions 16 is attracted to, and generally neutralized by, second electrode 12, the momentum transferred to the neutral fluid molecules 17 carries them past second electrode 12 at a certain velocity. The movement of fluid produced by EHD principles has been variously referred to as "electric," "corona" or "ionic" wind and has been defined as the movement of gas induced by the movement of ions from the vicinity of a high voltage discharge electrode 10.

Figure 2:
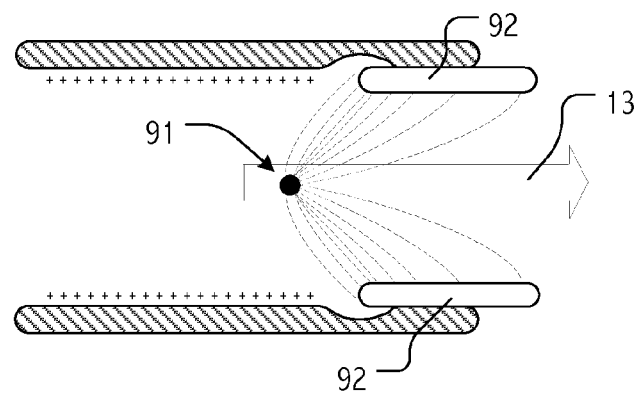
FIG. 2 depicts an illustrative EHD fluid mover electrode geometry.

FIG. 2, in turn, illustrates in cross-section, a practical EHD air mover design for thin form factor applications, which builds on EHD principals and in which an ion flow from emitter electrode 91 toward surfaces of collector electrodes 92 transfers momentum to air molecules. The result is a net flow in the downstream direction denoted by arrow 13.

EHD fluid mover designs illustrated herein generally include a single elongate wire, corona discharge type emitter electrode, although (more generally) multiple emitter electrodes and other emitter geometries may be employed. Typically, corona discharge type emitter electrodes include a portion (or portions) that exhibit(s) a small radius of curvature and may take the form of a wire, rod, edge or point(s). Other shapes for corona discharge electrodes are also possible; for example, the corona discharge electrode may take the shape of barbed wire, wide metallic strips, and serrated plates or non-serrated plates having sharp or thin parts that facilitate ion production at the portion of the electrode with the small radius of curvature when high voltage is applied.

In general, emitter electrodes may be fabricated in a wide range of materials. For example, in some embodiments, a corona discharge type emitter electrode is formed of Palladium Nickel (PdNi) plated Tungsten (W) wire with a Rhodium (Rh) coating. See e.g., commonly-owned, co-pending U.S. patent application Ser. No. 13/302,811, filed Nov. 22, 2011, entitled "EMITTER WIRE WITH LAYERED CROSS-SECTION" and naming Gao, Jewell-Larsen and Humpston as inventors which is incorporated herein for a description of suitable and illustrative emitter wire metallurgy. In some embodiments, compositions such as described in U.S. Pat. No. 7,157,704, filed Dec. 2, 2003, entitled "Corona Discharge Electrode and Method of Operating the Same" and naming Krichtafovitch et al. as inventors may be employed. U.S. Pat. No. 7,157,704 is incorporated herein for the limited purpose of describing materials for some emitter electrodes that may be employed in some corona discharge-type embodiments. In general, a high voltage power supply creates the electric field between emitter and collector electrodes.

EHD fluid mover designs illustrated herein include ion collection surfaces positioned downstream of one or more corona discharge electrodes. Often, ion collection surfaces of an EHD fluid mover portion include leading surfaces of generally planar collector electrodes extending downstream of the corona discharge electrode(s). In small form factor designs that seek to minimize flow channel height, collector electrode surfaces may be positioned against, or may partially define opposing walls of, the flow channel. In some cases, a collector electrode may do double-duty as heat transfer surfaces. In some cases, a fluid permeable ion collection surface may be provided. In some cases, wire- or rod-type collector electrodes may be introduced in the flow channel instead of, or in addition to, electrode surfaces positioned against on along channel walls.

In general, collector electrode surfaces may be fabricated of, or with, any suitable conductive material or surface, such as aluminum or copper. Alternatively, as disclosed in U.S. Pat. No. 6,919,698 to Krichtafovitch, collector electrodes (referred to therein as "accelerating" electrodes) may be formed of a body of high resistivity material that readily conducts a corona current, but for which a result voltage drop along current paths through the body of high resistivity collector electrode material provides a reduction of surface potential, thereby damping or limiting an incipient sparking event. Examples of such relatively high resistance materials include carbon filled plastic, silicon, gallium arsenide, indium phosphide, boron nitride, silicon carbide, and cadmium selenide. U.S. Pat. No. 6,919,698 is incorporated herein for the limited purpose of describing materials for some collector electrodes that may be employed in some embodiments. Note that in some embodiments described herein, a surface conditioning or coating of high resistivity material (as contrasted with bulk high resistivity) may be employed.

In embodiments that employ wire- or rod-type collector electrodes, the multiple parallel collector electrodes surfaces may be formed as metal wires or may be made of cut or etched metal, or formed in some other fashion. In some cases, even a conductive dielectric may be acceptable. Typically, surface material of such wire- or rod-type collector electrodes is conductive, but need not be a particularly good conductor. Indeed, consistent with the description of the above incorporated '698 patent, collector electrodes may be fashioned of or coated with fairly high electrical resistance material. In general, collector electrode surfaces should be resistant to ion bombardment and ozone. Noble metal surfaces such as gold (Au) and platinum (Pt) group metals) are generally suitable as are Ni and stainless steel. A core material could be the same as the surface, but may also be different. Each wire- or rod-type collector strand can be fairly thick (at least when compared to the emitter electrode) at between 50 µm to 200 µm, so material strength may not be particularly critical. At smaller collector electrode cross-sections, tungsten (W), titanium (Ti), molybdenum and/or alloys thereof are options. As with other collector electrode geometries, a smooth surface finish is desirable.

In embodiments that employ wire-type collector electrodes, very fine wire cross-sections and frictionally engaged in-situ cleaning/conditioning, a mechanically robust, engineered electrode with high-strength electrode core material such as titanium, steel, tungsten, tantalum, molybdenum, nickel and alloys containing these metals and one or more hard and electrochemically robust layers of palladium (Pd), other platinum (Pt) group metals, palladium nickel (PdNi), etc. overlaid thereon may be desirable. In some cases, emitter electrode materials and metallurgy (see above) developed to withstand frictional cleaning/conditioning and/or resistance to erosion in the corona may also be employed in collector electrode designs.

Field Shaping Features

Figure 3:
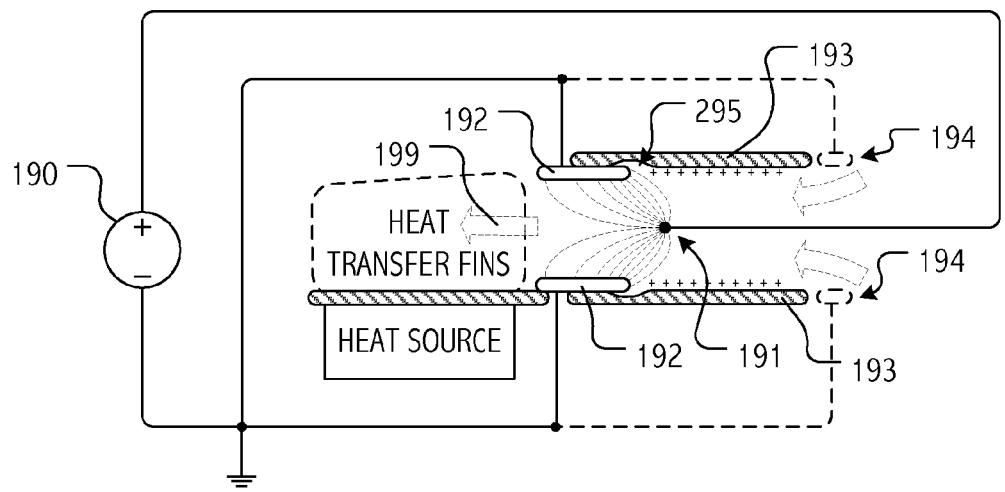
FIG. 3 depicts an illustrative electrohydrodynamic (EHD) fluid mover configuration in which emitter and collector electrodes are energized to motivate fluid flow and which provides a trench formed in channel wall dielectric material for reduction of arcing electrostatic discharge.

FIG. 3 depicts an illustrative EHD fluid mover configuration (with an illustrative power supply circuit schematic overlaid thereon) in which a high voltage power supply 190 is coupled between an emitter electrode 191 and collector electrodes 192 to generate an electric field and in some cases ions that motivate fluid flow 199 in a generally downstream direction. In the illustration, emitter electrode 191 is coupled to a positive high voltage terminal of power supply 190 (illustratively +3.5 KV, although specific voltages and, indeed, any supply voltage waveforms may be matters of design choice) and collector electrodes 192 are coupled to a local ground. See previously incorporated U.S. Pat. No. 6,508,308 for a description of suitable designs for power supply 190. Given the substantial voltage differential and short distances involved (perhaps 1 mm or less) between emitter electrode 191 and leading surfaces of collector electrodes 192, a strong electrical field is developed which imposes a net downstream motive force on positively charged ions (or particles) in the fluid. Field lines illustrate (generally) spatial aspects of the resulting electric field and spacing of the illustrated field lines is indicative of field strength.

As will be understood by persons of ordinary skill in the art, corona discharge principles may be employed to generate ions in the intense electric field closely proximate the surface of a corona-discharge type emitter electrode. Thus, in corona discharge type embodiments in accord with FIG. 3, fluid molecules (such as surrounding air molecules) near emitter electrode 191 become ionized and the resulting positively charged ions are accelerated in the electric field toward collector electrodes 192, colliding with neutral fluid molecules in the process. As a result of these collisions, momentum is transferred from the ions to neutral fluid molecules, inducing a corresponding movement of fluid molecules in a net downstream direction. While the positively charged ions are attracted to, and neutralized by, collector electrodes 192, the neutral fluid molecules move past collector electrodes 192 at an imparted velocity (as indicated by fluid flow 199). As before, the movement of fluid produced by corona discharge principles is variously referred to as "electric," "corona" or "ionic" wind and has generally been defined as the movement of gas induced by the movement of ions from the vicinity of a high voltage discharge electrode.

Notwithstanding the descriptive focus on corona discharge type emitter electrode configurations, persons of ordinary skill in the art will appreciate that ions may be generated by other techniques such as silent discharge, AC discharge, dielectric barrier discharge (DBD), or the like, and once generated, may, in turn, be accelerated in the presence of electrical fields to motivate fluid flow as described herein. For avoidance of doubt, emitter electrodes need not be of a corona discharge type in all embodiments. Also for avoidance of doubt, power supply voltage magnitudes, polarities and waveforms (if any) described with respect to particular embodiments are purely illustrative and may differ for other embodiments.

Some embodiments described herein will be further understood in light of certain surfaces provided adjacent to and upstream of emitter electrode 191 to shape the electric previously described electric field and/or to provide a barrier to upstream migration of ions. For example, relative to the illustration of FIG. 3, dielectric surfaces 193 are provided on which positive charge (such as from ions generated at a corona discharge type instance of emitter electrode 191 or elsewhere) tends to accumulate. Because dielectric surfaces 193 do not provide an attractive path to ground, a net positive charge tends to accumulate and thereafter operates to electrostatically repel like charges. As a result, dielectric surfaces 193 are electrostatically operative as a barrier to upstream migration of positively charged ions. Upstream dielectric surfaces 193 also tend to electrostatically mask any otherwise attractive paths to ground, thereby shaping the previously described electric field in the primarily downstream direction toward collector electrodes 192.

To improve performance and to reduce the likelihood of arcing electrostatic discharge to collector electrodes 192 of the charge accumulated on respective dielectric surfaces 193, a variety of field shaping features may be provided in the region generally between leading edges of collector electrodes 192 and adjacent portions of dielectric surfaces 193. For example, in some embodiments, an air gap may be provided in the form of a shallow trench 395 formed in dielectric surfaces 193 as illustrated in FIG. 3. The separation provided by shallow trench 395, together with an electrically attractive, largely "line-of-sight" ion flow path (along illustrated field lines) to leading edges of collector electrodes 192 means that little (if any) charge accumulates on the portion of dielectric surfaces 193 immediately adjacent to those leading edges. As a result, likelihood of arcing electrostatic discharge from these immediately adjacent portions of dielectric surfaces 193 is reduced.

Figure 4:
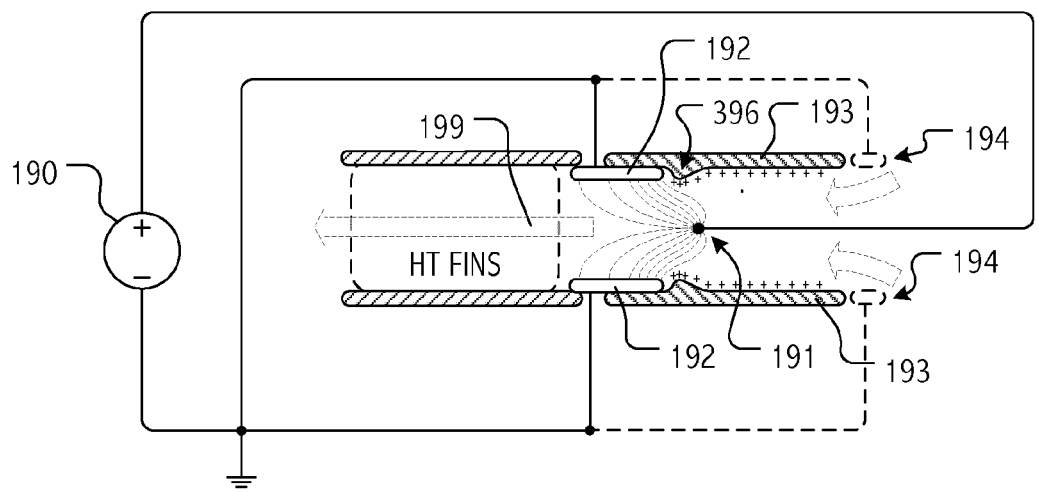
FIG. 4 depicts a variation on the EHD fluid mover configuration of FIG. 3 in which charge accumulation along a narrow berm formed in channel wall dielectric material provides field shaping and contributes to a reduction of arcing electrostatic discharge.

Alternatively, in some embodiments, a berm 496 formed in dielectric surfaces 193 just upstream of leading edges of collector electrodes 192 may create (during EHD operation) a narrow region of accumulated charge concentration and thereby shape the electric field in such a way (see FIG. 4) that ion flow is diverted around the portion of dielectric surfaces 193 immediately adjacent to the leading edge of respective collector electrodes 192. The localized charge concentration illustrated at the convex surface contour of berm 496 tends to shadow those portions of dielectric surfaces 193 most closely proximate to leading edges of collector electrodes 192 from charge accumulation. As a result, likelihood of arcing electrostatic discharge from these most closely proximate portions is reduced.

Figure 5:
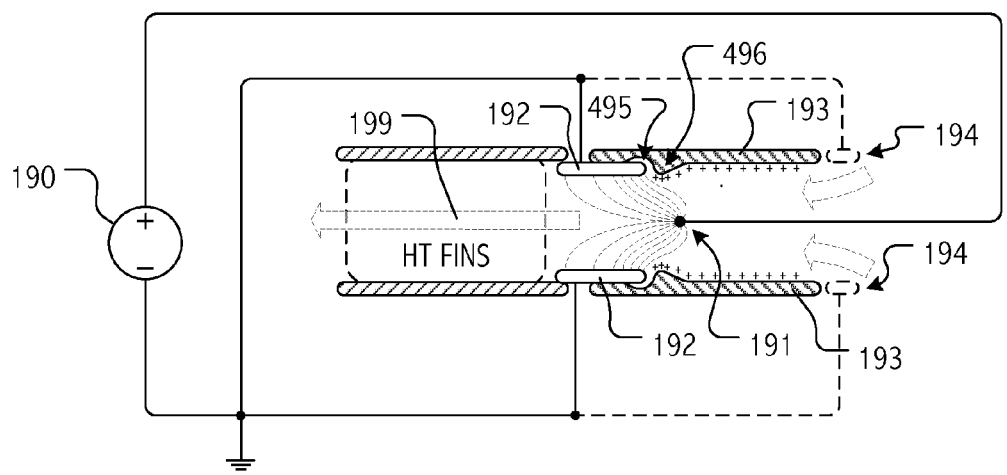
FIG. 5 depicts a further variation on the EHD fluid mover configuration of FIG. 3 in which both a shallow trench and a narrow berm are formed in channel wall dielectric material.

In some embodiments such as illustrated in FIG. 5, both a berm 596 and a shallow trench 595 are formed in dielectric surfaces 193 just upstream of leading edges of collector electrodes 192. As before, the structure creates a narrow region of accumulated charge concentration and thereby shape the electric field in such a way (see FIG. 4) that ion flow is diverted around the portion of dielectric surfaces 193 immediately adjacent to the leading edge of respective collector electrodes 192. Shallow trench 595 provides a further air gap to limit arcing electrostatic discharge.

Figure 6:
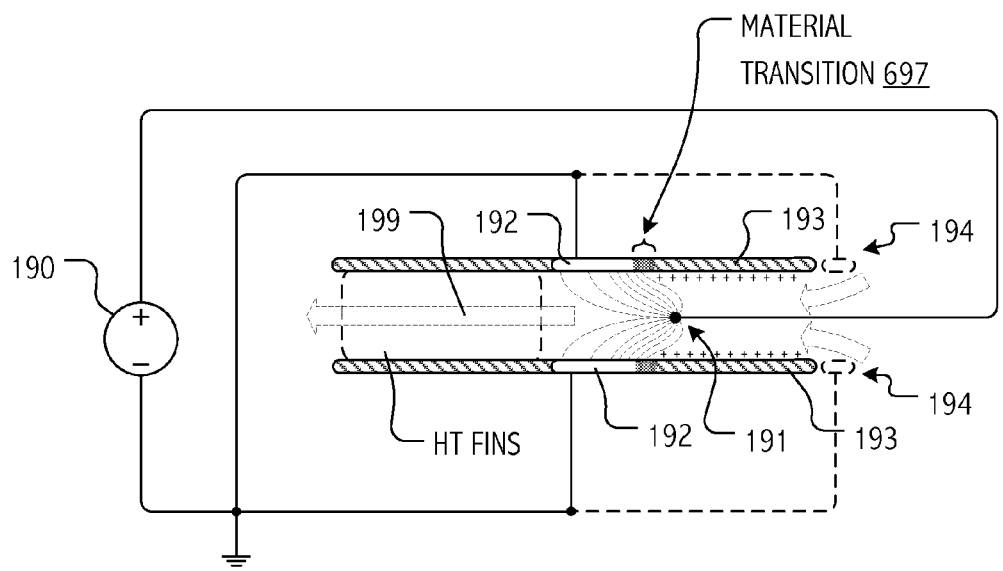
FIG. 6 depicts an illustrative electrohydrodynamic (EHD) fluid mover configuration in which field shaping is provided by charge accumulation along channel wall dielectric material and provides a material transition from dielectric to conductive but resistive material that facilitates bleed off of charge that might otherwise accumulate immediately adjacent the leading edge of collector electrodes.

FIG. 6 depicts still another illustrative EHD fluid mover configuration in which field shaping is provided by charge accumulation along channel wall dielectric material 193. In the illustrated embodiment, a material transition 697 from dielectric material (abutting dielectric material 193) to conductive but resistive material (abutting the leading edge of respective collector electrodes 192) provides an increasingly conductive path (at decreasing distance to collector electrodes 192) to bleed off of charge that might otherwise accumulate immediately adjacent the leading edge of collector electrodes. In general, the conductive path provided by transition material immediately adjacent the leading edge of a collector electrode 192 is less resistive than that provided by transition material at increasing distance.

As will be appreciated, spatial variation in the resistance presented by a conductive path through material transition 697 may be affected by a variety of factors, including spatial variation in the resistivity of the material itself (e.g., based on composition or doping), varying thickness of the material, a staged transition in material composition and/or thickness, etc. In each case, the portion of material transition 697 most immediately proximate to a collector electrode 192 provides a conductive, generally less resistive path to collector electrode 192 (and ground) thereby facilitating bleeding off of charge that might otherwise be accumulated immediately adjacent a leading edge of a respective collector electrode 192. At increasing distance from the collector electrode 192, increasing resistance results in a less and less attractive conductive path to collector electrode 192 (and ground). In some embodiments, material transition 697 extends over about 1 mm of channel length.

Although the illustration of FIG. 6 presents a generally co-planar arrangement of channel wall dielectric material 193, transition zone material 193 and collector electrodes 192 without trench- or berm-type structural features previously described, it is contemplated that some embodiments may incorporate one or more of such structural features in combination with the illustrated material transition 697.

Optionally, in some embodiments (whether consistent with FIG. 1, 2, 3, 4, 5 or 6), one or more conductive paths to ground may be provided further upstream of dielectric surfaces 193 to capture rogue positively charged ions that may migrate upstream, notwithstanding the field shaping (and repelling effect) provided by accumulated charge along upstream portions of dielectric surfaces 193. For example, in some ventilated device embodiments, such upstream electrodes 194 may provide a conductive path to ground proximate to, or integral with, an inlet vent. In some ventilated device embodiments, a further conductive path to ground (not specifically shown) may be provided proximate to, or integral with, an outlet vent.

When coupled to an appropriate potential (here ground) electrodes 194 provide an charge sink for ions that migrate upstream notwithstanding net downstream flow 199 and the repulsive ion barrier provided by charge (here positive) that accumulates on dielectric surfaces 193 that define upper and lower walls of the flow channel (as well as on sidewalls not visible in the illustrated cross-sections) upstream of emitter electrode 191.

Figure 7:
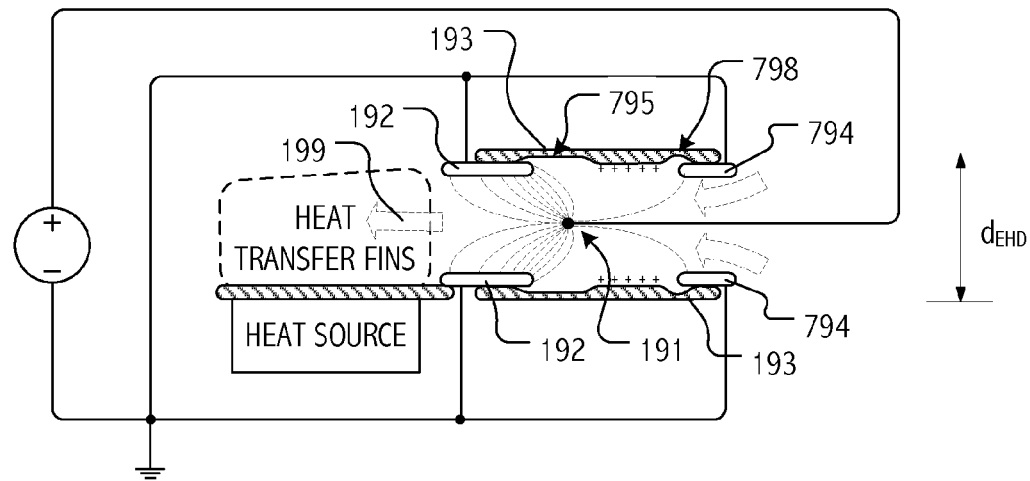
FIG. 7 depicts another illustrative electrohydrodynamic (EHD) fluid mover configuration in the shallow trench formed in channel wall dielectric material extends from leading surfaces of collector electrodes toward and slightly upstream of an emitter electrode.

FIG. 7 illustrates still another embodiment in which the shallow trenches formed in dielectric surfaces 193 adjacent leading edges of collector electrodes 192 extend further upstream toward and slightly past emitter electrode 191. In the illustrated variation, shallow trenches 795 not only limit arcing electrostatic discharge from proximate portions of dielectric surfaces 193 (as previously described with reference to trenches 396, recall FIG. 3), but also marginally increase the distances from emitter electrode 191 to nearest dielectric surfaces 193 that define upper and lower walls of the flow channel.

To understand one benefit of such increased distance, consider the following. As overall EHD device sizing is reduced, even the marginal increase in emitter to wall distance afforded by extended shallow trenches 795 may provide operational benefits. Because charge captured and retained on dielectric surfaces most closely proximate to emitter electrode 191 will be of like polarity (here positive), such charge tends to reduce electric field gradient in the vertical dimension of FIG. 7 (i.e., from emitter electrode 191 toward upper and lower walls of the flow channel. As the distance to dielectric surfaces 193 that define upper and lower walls decreases, higher voltage will typically be required to sustain a given level of corona discharge. Higher voltages tend to result in higher susceptibility to electrostatic discharge or arcing. Accordingly, by extending illustrated shallow trenches 795 upstream past emitter electrode 191, a given level of performance can often be maintained despite reductions in overall EHD device size (and in particular channel height, $d_{EHD}$). Alternatively, at a given EHD device size (and channel height, $d_{EHD}$), desired field gradients and levels of corona discharge may be produced at generally lower voltage and with generally reduced susceptibility to electrostatic discharge or arcing. Persons of ordinary skill in the art will appreciate other design or operational trade-offs based on the description herein.

For purposes of illustration, FIG. 7 also depicts a particular design in which upstream ion capture electrodes are (like the collector electrodes previously illustrated and described) affixed to or fashioned on the dielectric surfaces 193 that define upper and lower walls of the flow channel. As with the downstream collector electrodes 192, field shaping features may be provided in the region generally between leading edges of ion capture electrodes 794 and adjacent portions of dielectric surfaces 193. Note that for purposes of the upstream ion capture electrodes 794, "leading" means from the perspective of the limited ion flow (migration) upstream that the ion capture electrodes 794 are intended to capture. As before, an air gap is provided in the form of a shallow trench (here 798) formed in dielectric surfaces 193. The separation provided by shallow trench 789, together with an electrically attractive, largely "line-of-sight" ion flow path (along illustrated field lines) to leading edges of ion capture electrodes 794 means that little (if any) charge accumulates on the portion of dielectric surfaces 193 immediately adjacent to those leading edges. As a result, likelihood of arcing electrostatic discharge from these immediately adjacent portions of dielectric surfaces 193 is reduced.

Based on the description herein, persons of ordinary skill in the art will appreciate that ion capture may be provided in EHD air mover design variants (including those illustrated in FIGS. 3-6) using ion capture electrodes akin to those illustrate as ion capture electrodes 794. In such case, shallow trenches in respective dielectric surfaces 193 akin to shallow trenches 798 may be provided to similarly reduce likelihood of arcing electrostatic discharge from immediately adjacent portions of dielectric surfaces 193.

Figure 8:
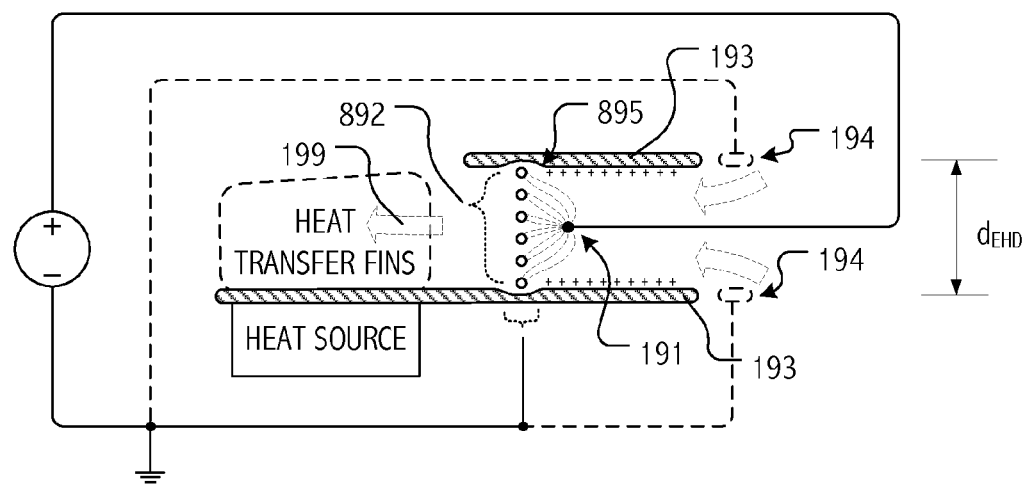
FIG. 8 depicts another illustrative electrohydrodynamic (EHD) fluid mover configuration in which emitter and collector electrodes are energized to motivate fluid flow. Wire-type collector electrodes are provided and, as before, a shallow trench is formed in channel wall dielectric material for reduction of arcing electrostatic discharge.

FIG. 8 depicts a variation on the embodiment of FIG. 3 in which alternative collector electrode geometry is used. More specifically, FIG. 8 illustrates a cross-section of plural collector electrode 892 wires or rods arrayed to span a lateral extent of a flow channel. In the illustration, six generally parallel collector electrodes 892, each having longitudinal extent and together distributed across the flow channel from upper to lower dielectric surfaces 193, are positioned to collect ion flow from emitter electrode 191. As before, emitter and collector electrodes (here 191, 892) are energized to motivate fluid flow in a generally downstream direction 199. To avoid obscuring electrode geometries, supply voltage connections to individual collector electrode instances are omitted, although persons of ordinary skill in the art will appreciate that longitudinal extent of the collector electrodes 892 allows connections through dielectric sidewalls (not specifically shown in the cross-sectional view). Design and operation of the FIG. 8 variation will be understood based on the foregoing description of other embodiments (including that of FIG. 3).

In general, collector geometries in accord with FIG. 8 et seq. tend to allow EHD air mover implementations in which dielectric top and bottom wall surfaces 193 may be even more closely spaced than may be practical in the wall positioned collector embodiments previously illustrated. Specifically, as previously illustrated embodiments are shrunk (in the vertical dimension), more and more of the ion flux (from emitter electrode 191) impinges on leading bull nosed surfaces of collector electrodes 192 which, consistent with a design shrink, exhibit smaller bull nose radii and accordingly present smaller and smaller surface area to the ion flux. Therefore, by providing a multiplicity of collector electrodes 892 across substantial height of the flow channel, greater aggregate surface area for ion collection may be provided. In some cases, collector electrode geometries in accord with FIG. 8 et seq. facilitate designs in which channel heights, $d_{EHD}$, of 4 mm or less may be provided. In some cases, emitter and collector electrodes (191, 892) may be provided using wires (e.g., PdNi coated W wire) of similar composition, although at 50 μm to 200 μm diameter, collector electrode wires will generally exceed diameters of emitter electrode wires by at least a factor of two (2). Accordingly, use of core and surface materials optimized for extremely fine emitter wire configurations may be unnecessary and costly in some embodiments.

Generally, surface material of collector electrodes 892 is conductive, but need not be a particularly good conductor. Indeed, consistent with the description of the above incorporated '698 patent, collector electrodes 892 may be fashioned of or coated with fairly high electrical resistance material. In general, collector electrodes 892 surfaces should be resistant to ion bombardment and ozone. Noble metal surfaces such as gold (Au) and platinum (Pt) group metals) are generally suitable as are Ni and stainless steel. In some embodiments and as previously described, a core of differing composition material may be employed. Each collector electrode 892 can be fairly thick (at least when compared to the emitter electrode) at between 50 μm to 200 μm, so the additional strength by a tungsten (W), titanium (Ti), molybdenum (Mo) containing core may not be particularly important for collector electrode wires.

As with the previously illustrated collector electrode geometries, to improve performance and to reduce the likelihood of arcing electrostatic discharge to collector electrodes 692 from respective dielectric surfaces 193, a variety of field shaping features may be provided in the region generally between leading edges of collector electrodes 192 and adjacent portions of dielectric surfaces 193. For example, as illustrated in the embodiment of FIG. 8, an air gap may be provided in the form of a shallow trench 895 formed in dielectric surfaces 193. The separation provided by shallow trench 895, together with an electrically attractive, largely "line-of-sight" ion flow path (along illustrated field lines) to outermost ones of collector electrodes 892 means that little (if any) charge accumulates on the portion of dielectric surfaces 193 immediately adjacent to the outermost ones of collector electrodes 892. As a result, likelihood of arcing electrostatic discharge from these immediately adjacent portions of dielectric surfaces 193 is reduced.

Figure 9:
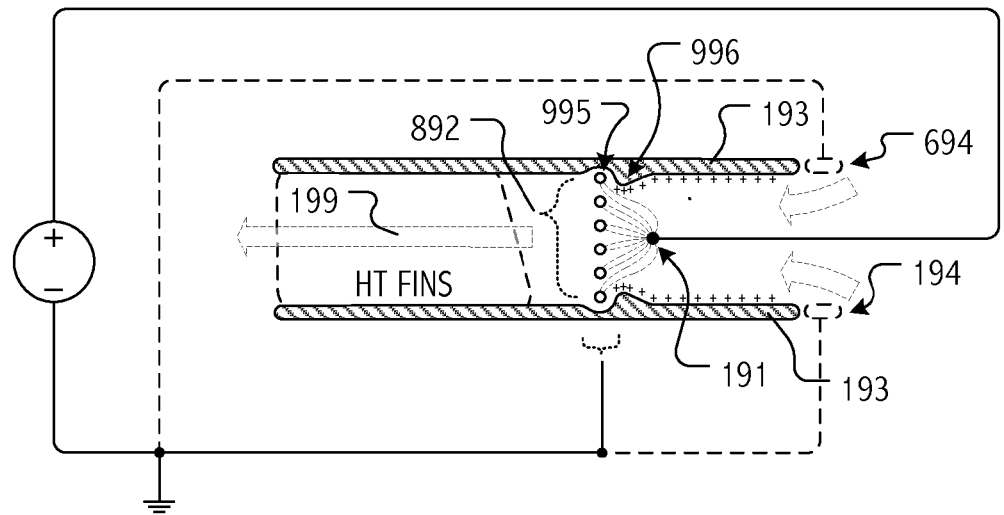
FIG. 9 depicts a variation on the EHD fluid mover configuration of FIG. 8 in which both a shallow trench and a narrow berm are formed in channel wall dielectric material. Charge accumulation along narrow berm provides field shaping and contributes to a reduction of arcing electrostatic discharge.

As will be appreciated based on the foregoing description of FIGS. 3-7, additional or alternative field shaping features may be provided and adapted to the arrayed wire- or rod-type collector electrode geometry introduced in FIG. 8. For example, in the embodiment of FIG. 9, a trench and berm configuration may be employed where a berm 996 is formed in dielectric surfaces 193 just upstream of leading edges of collector electrodes 692 and a shallow trench 995 provides air gap separation from dielectric surfaces 193. As before, the berm (here berm 996 in conjunction with shallow trench 995) may result in (during EHD operation) a narrow region of accumulated charge concentration and thereby shape the electric field in such a way (see FIG. 9) that ion flow is diverted around the portion of dielectric surfaces 193 immediately adjacent to the leading edge of respective uppermost and lowermost instances of collector electrodes 892. The localized charge concentration illustrated at the convex surface contour of berm 996 further shadows from charge accumulation those portions of dielectric surfaces 193 most closely proximate to leading edges of those collector electrode 892 wires most closely proximate upper and lower dielectric surfaces 193. As a result, likelihood of arcing electrostatic discharge from these most closely proximate portions is reduced.

Figure 10:
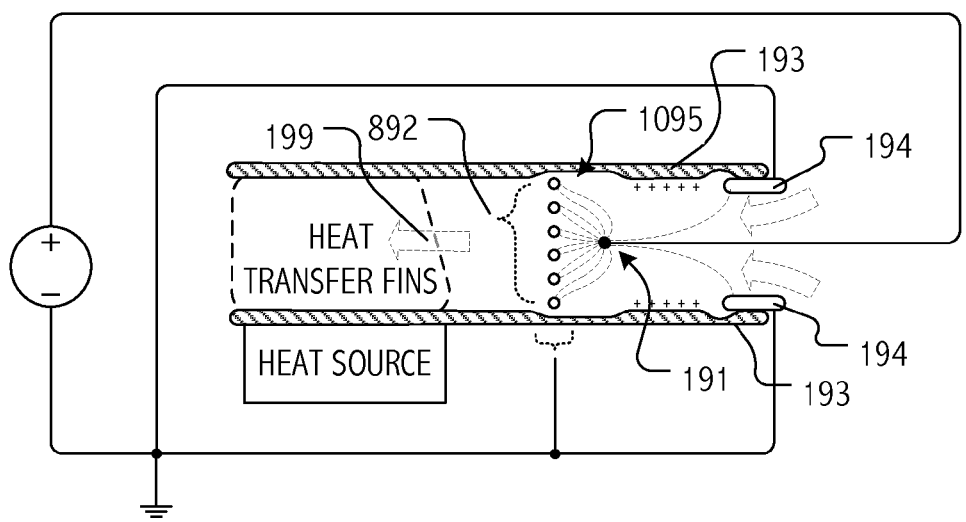
FIG. 10 depicts a further variation on the EHD fluid mover configuration of FIG. 8 in which the shallow trench formed in channel wall dielectric material extends from collector electrodes toward and slightly upstream of an emitter electrode.

FIG. 10 illustrates still another embodiment in which the shallow trenches formed in dielectric surfaces 193 adjacent leading edges of collector electrodes 892 extend further upstream toward and slightly past emitter electrode 191. In the illustrated variation, shallow trenches 1095 not only provide an air gap to limit arcing electrostatic discharge from proximate portions of dielectric surfaces 193, but also marginally increase the distances from emitter electrode 191 to nearest dielectric surfaces 193 that define upper and lower walls of the flow channel. As before, by extending illustrated shallow trenches 1095 upstream past emitter electrode 191, a given level of performance can often be maintained despite reductions in overall EHD device size and, in particular, channel height. Alternatively, at a given EHD device size and channel height, desired field gradients and levels of corona discharge may be produced at generally lower voltage and power and with generally reduced susceptibility to electrostatic discharge or arcing. The embodiment of FIG. 10 will be understood relative to the forgoing description, including that of FIG. 7.

Figure 11:
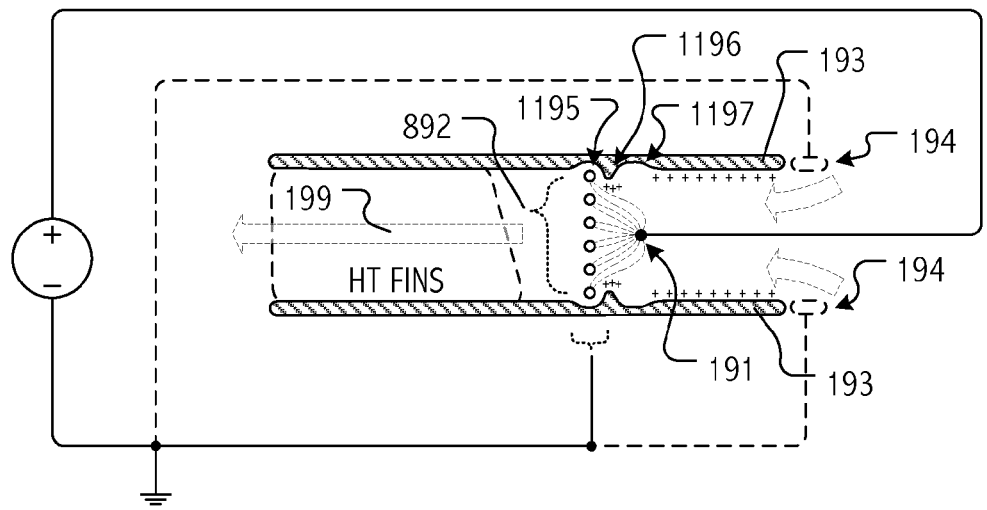
FIG. 11 depicts still another variation on the EHD fluid mover configuration of FIG. 8 in which shallow trenches formed in channel wall dielectric material most closely proximate emitter and collector electrodes are punctuated by a narrow medial berm that provides further field shaping and contributes to further reduction of arcing electrostatic discharge.
Figure 12:
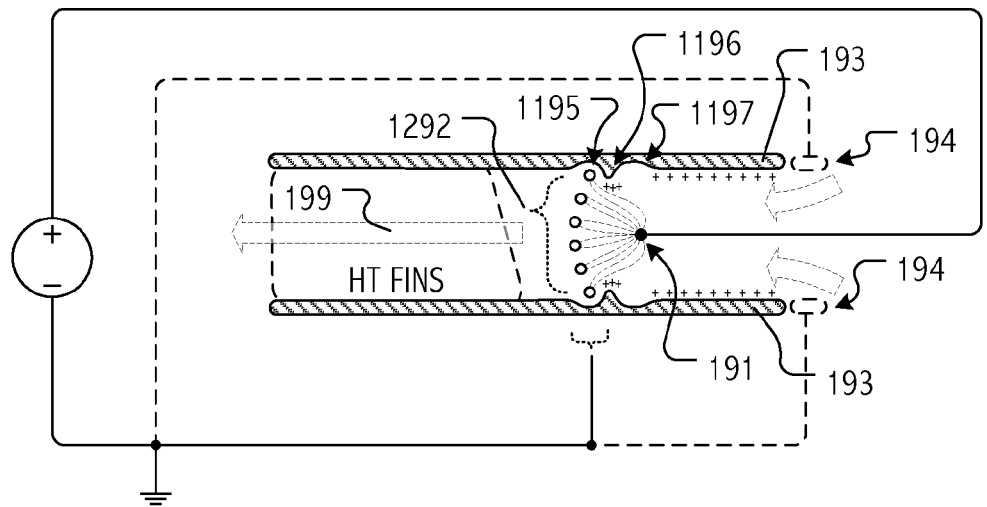
FIG. 12 depicts a further variation on the EHD fluid mover configuration of FIG. 11 in which wire-type collector electrodes are arrayed to present a generally concave set of surfaces for ion collection.

FIGS. 11 and 12 illustrate embodiments in which the shallow trench feature(s) is (are) provided along upper and lower dielectric surface 193 portions most closely proximate the emitter and collector electrodes but, in addition, a medial berm feature 1196 is used to further shape the electric field. In particular, FIG. 11 illustrates a resultant field pattern by which ion flow is diverted around the portion of dielectric surfaces 193 immediately adjacent to the leading edge of respective uppermost and lowermost instances of collector electrodes 892. Shallow trench portions 1195 provide air gap separation between uppermost and lowermost instances of collector electrodes 892 and dielectric surfaces 193, while shallow trench portions 1197 increases the distance from emitter electrode 191 to nearest dielectric surfaces 193 that define upper and lower walls of the flow channel.

As previously explained relative to the embodiment of FIG. 7, as overall EHD device sizing is reduced, even a marginal increase in emitter to wall distance afforded by extended shallow trenches 795 may provide operational benefits. Because charge captured and retained on dielectric surfaces most closely proximate to emitter electrode 191 will be of like polarity (here positive), such charge tends to reduce electric field gradient in the vertical dimension of FIG. 7 (i.e., from emitter electrode 191 toward upper and lower walls of the flow channel. As the distance to dielectric surfaces 193 that define upper and lower walls decreases, higher voltage will typically be required to sustain a given level of corona discharge. Higher voltages tend to result in higher susceptibility to electrostatic discharge or arcing and higher power. Accordingly, by providing illustrated shallow trench portions 1197, a given level of performance can often be maintained despite reductions in overall EHD device size and, in particular, channel height. Alternatively, at a given EHD device size and channel height, desired field gradients and levels of corona discharge may be produced at generally lower voltage and power and with generally reduced susceptibility to electrostatic discharge or arcing.

FIG. 12 introduces the additional design variation of a concave leading surface presentation of the arrayed wire- or rod-type collector electrode geometry. In the illustrated concave geometry, a somewhat more even distribution of ion flux may be achieved across the array of collector electrodes 1292. In other respects, the design embodiment of FIG. 12 (and operation thereof) is analogous to that of FIG. 11, previously described. Persons of ordinary skill in the art will appreciate that embodiments illustrated in FIG. 8 et seq. may each be modified to provide a concave leading surface presentation of arrayed wire- or rod-type collector electrodes.

Systems and Electronic Device Embodiments

Figure 13A:
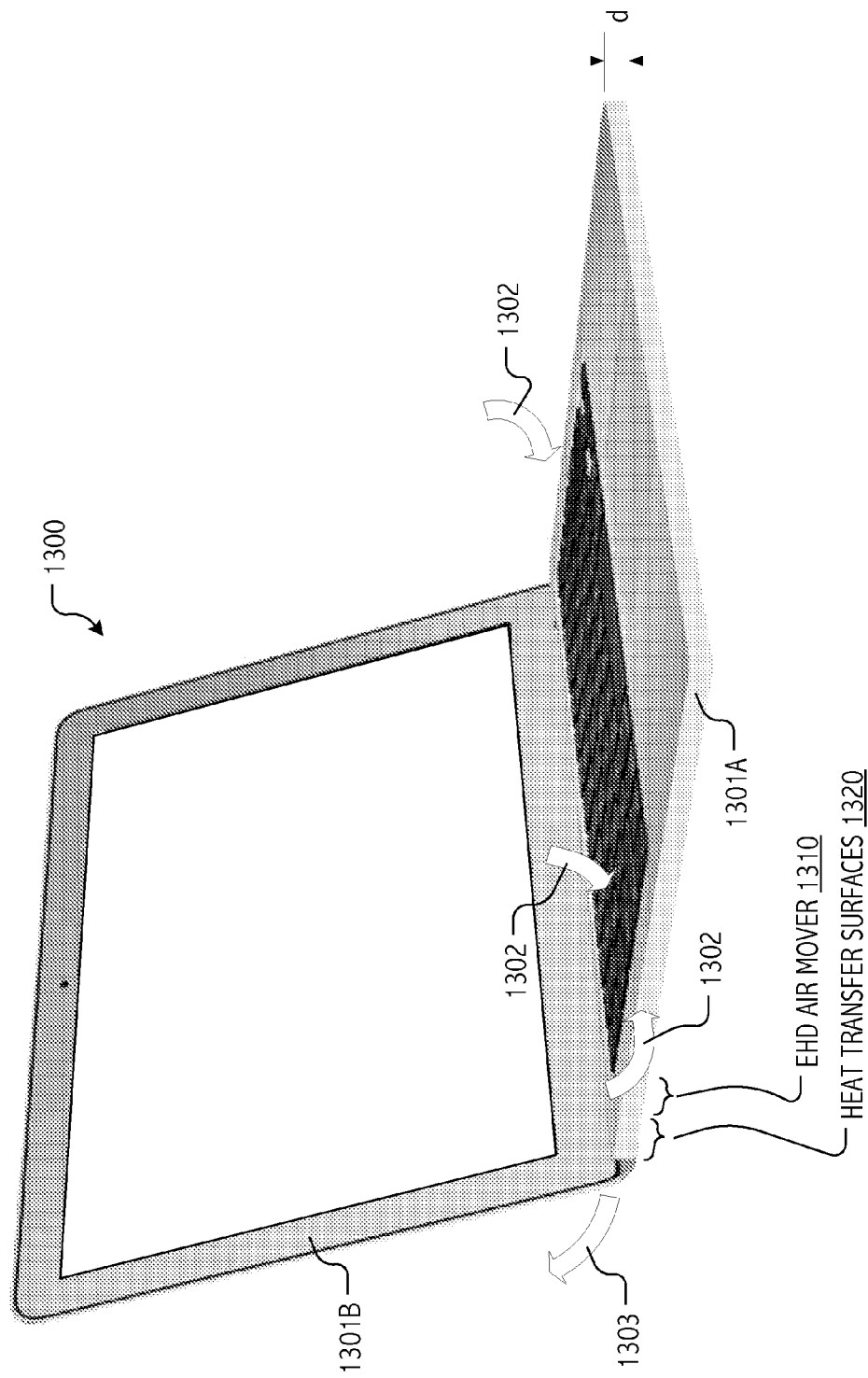
FIG. 13A is a perspective view of an illustrative, laptop-style, consumer electronics device in which, in accord with some embodiments of the present invention, an EHD fluid mover is accommodated within a total device thickness, d, of typically less than about 10 mm.

FIG. 13A is a perspective view of an illustrative, laptop-style, consumer electronics device 1300 in which, in accord with some embodiments of the present invention, an EHD fluid mover is accommodated within a body portion 1301A having a total thickness d of less than about 10 mm. FIG. 13A illustrates exemplary inflows 1302 and outflows 1303 that may be motivated through the consumer electronics device by an EHD air mover 1310 designed and packed within the limited interior in accord with some inventive concepts of the present inventions. In some implementations, available interior volumes and/or assemblies may allow only 5 mm or less of the total thickness d for EHD air mover 1310. Of course, positions illustrated for inflow(s), outflow(s) and heat transfer surfaces 1320 are purely exemplary and, more generally, ventilation boundaries may be dictated by interior placement of components, thermal challenges of a particular device configuration and/or industrial design factors.

Figure 13B:
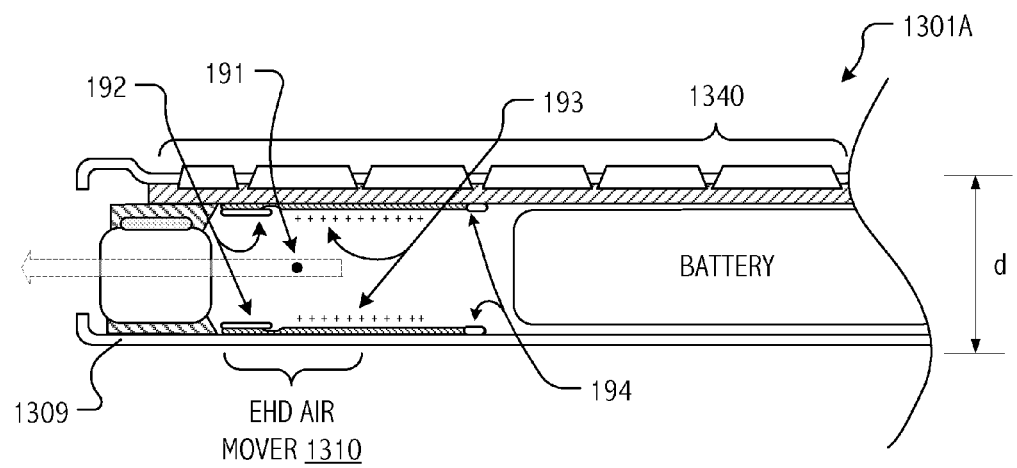
FIGS. 13B and 13C depict, in cross-sections generally corresponding to FIG. 13A, electrostatically operative surfaces of illustrative EHD air mover designs.
Figure 13C:
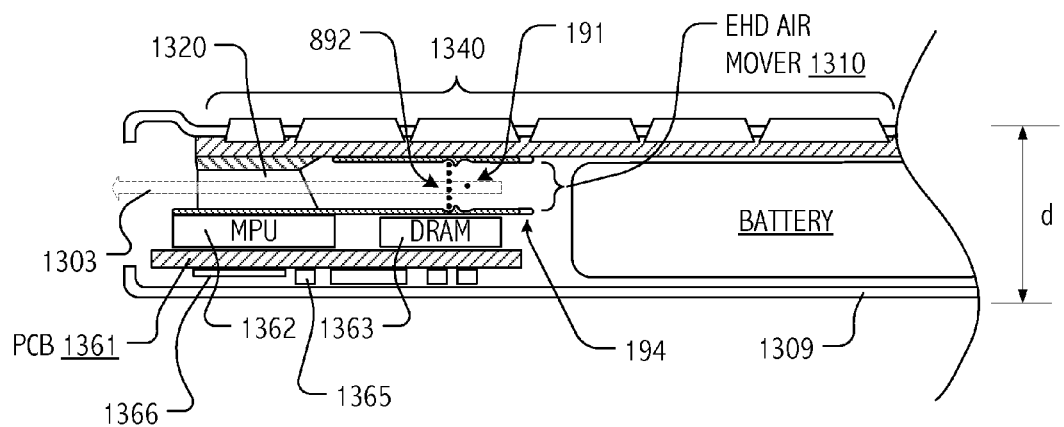

FIGS. 13B and 13C, in turn, illustrate integration of EHD air mover designs such as described hereinabove (recall FIG. 3 et seq. and FIG. 7 et seq.) within the enclosure 1309 of laptop-style, consumer electronics device 1300. In some cases, at least one of the electrostatically operative portions of an EHD air mover is formed as, or on, an interior surface of the enclosure itself. In some cases, at least one of the electrostatically operative portions is formed as, or on, a surface of an EMI shield that overlays an electronics assembly such as a keyboard assembly or circuit board. Such designs are described in greater detail in commonly-owned, co-pending U.S. patent application Ser. No. 13/105,343, filed May 11, 2011, entitled "ELECTROHYDRODYNAMIC FLUID MOVER TECHNIQUES FOR THIN, LOW-PROFILE OR HIGH-ASPECT-RATIO ELECTRONIC DEVICES" and naming Jewell-Larsen, Honer, Goldman and Schwiebert as inventors, which is incorporated herein for the purpose of further detailing illustrative system embodiments. In any case, EHD air mover designs such as described hereinabove can be accommodated within very limited interior spaces of laptop-style, consumer electronics device 1300 or analogously limited interior spaces of all-in-one or pad-type computing devices, smart phones, media players, book readers, etc.

Turning then illustratively to laptop-type consumer electronics devices such as illustrated in the FIGS. 13B and 13C cross-sections of body portion 1301A, total thickness d may be less than about 10 mm, with keyboard assembly 1340 occupying a portion of the available vertical section. The illustrated cross-section of FIG. 13B allows the substantial entirety of the interior vertical section to accommodate EHD air mover 1310, which for purposes of illustration and without limitation has been illustrated generally in accord with EHD air mover embodiment of FIG. 3. An analogous, but more tightly packed, vertical sections is illustrated in FIG. 13C and accommodates an instance of EHD air mover 1310 that has been illustrated generally in accord with the EHD air mover embodiment of FIG. 11. In the case of the FIG. 13 illustration, the EHD air mover as well as printed circuit board (PCB) mounted integrated circuits, discretes, connectors, etc.

occupy a substantial portion of the available interior space. Examples of PCB mounted integrated circuits include central processor units (CPUs) and/or graphics processor units (GPUs), communications processors and transceivers, memory, etc. (see e.g., components 1362, 1363, 1365 and 1366 on double-sided PCB 1361), which can often generate a substantial portion of the heat load and which, in some embodiments, are cooled by the very EHD fluid/air movers that can be accommodated closely proximate to the heat sources (or thermally coupled fins/spreaders).

Figure 14B:
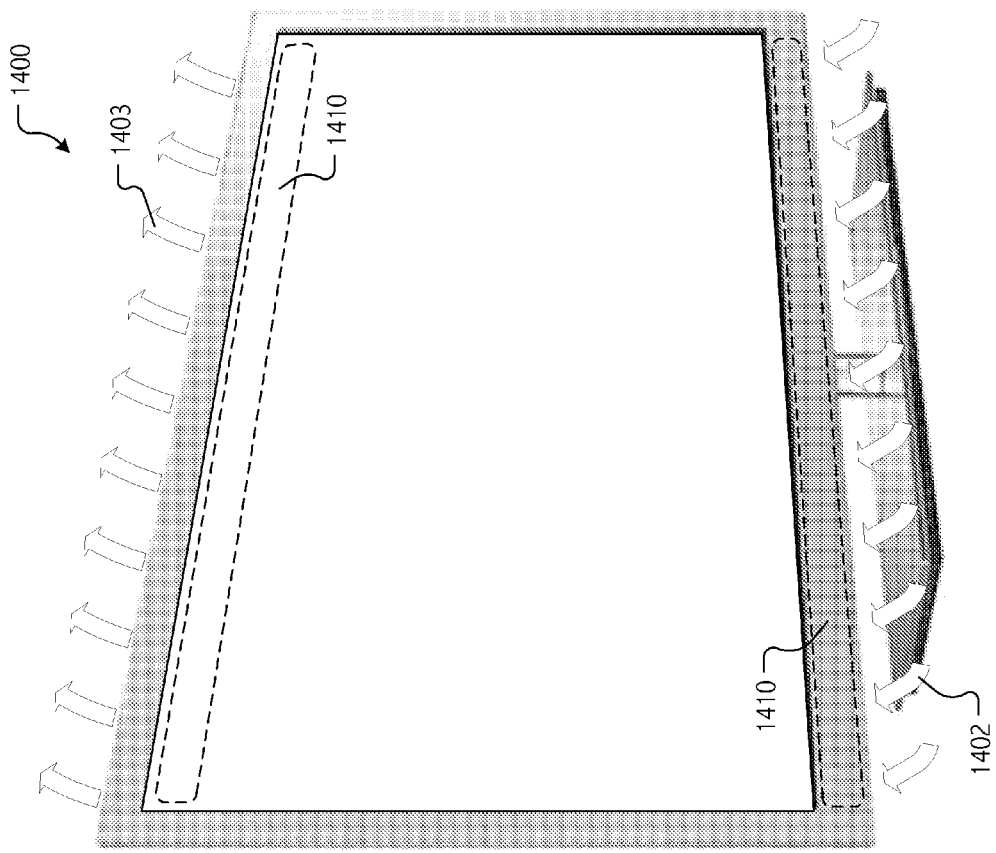
FIGS. 14A and 14B are respective edge-on side and perspective views of an illustrative, flat panel display style, consumer electronics device in which an EHD fluid mover is accommodated within a total device depth, d, typically less than about 10 mm.
Figure 14A:
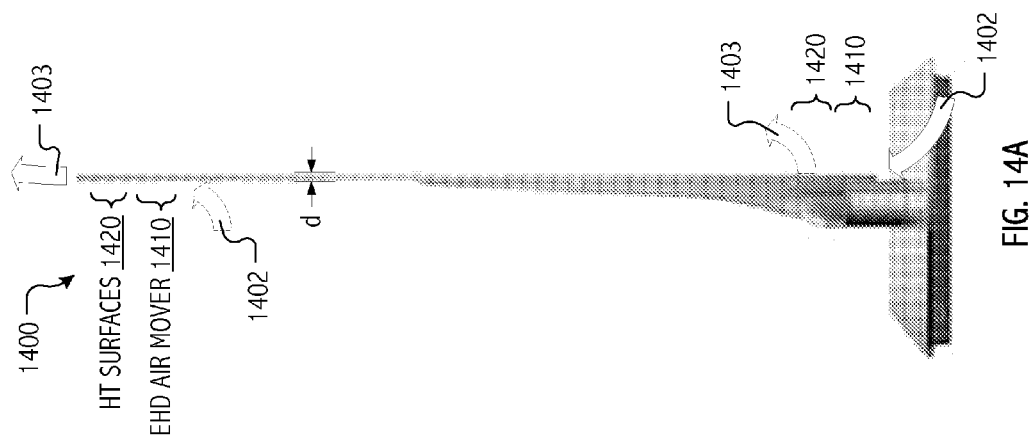

Turning to still another type of device contemplated, FIGS. 14A and 14B are respective edge-on side and perspective views of an illustrative, flat panel display style, consumer electronics device 1400 in which, in accord with some embodiments of the present invention, an EHD fluid mover is accommodated within a body portion 1401A having total thickness d of less than about 10 mm. FIG. 14A illustrates exemplary inflows 1402 and outflows 1403 that may be motivated through the consumer electronics device by EHD air movers 1410 designed and packed within the limited interior in accord with some inventive concepts of the present inventions. In some implementations, available interior volumes and/or assemblies may allow only 5 mm or less of the total thickness d for EHD air mover 1410.

Figure 15A:
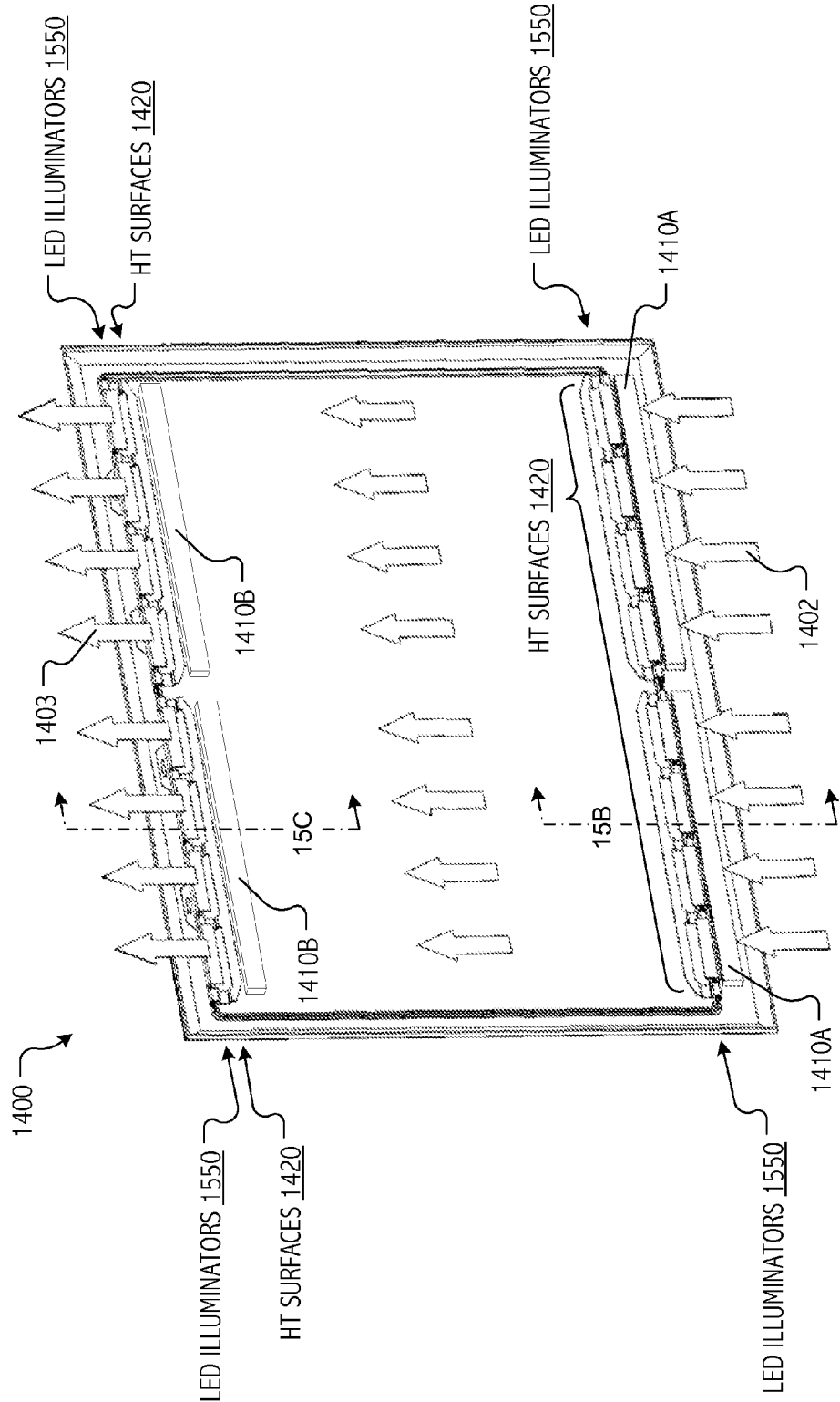
FIG. 15A is an interior view (generally in correspondence with flat panel display device of FIGS. 14A and 14B) illustrating positional relations between components and ventilating air flows.

Of course, positions illustrated for inflow(s), outflow(s) and heat transfer surfaces 1420 are purely exemplary and, more generally, ventilation boundaries may be dictated by interior placement of components, thermal challenges of a particular device configuration and/or industrial design factors. FIG. 15A depicts one embodiment generally in accord with FIGS. 14A and 14B, in which elongate, edge-positioned arrays of illumination sources (LED illuminators 1550) generate heat which, during operation, is convectively transferred by way of heat transfer surfaces 1420 into air flows (1402, 1403) motivated by EHD air movers 1410A, 1410B. In the illustrated configuration, bottom-mounted EHD air mover instances (1410A) force air into the enclosure at the bottom of consumer electronics device 1400, while top-mounted EHD air mover instances (1410B) exhaust air from the top.

Figure 15C:
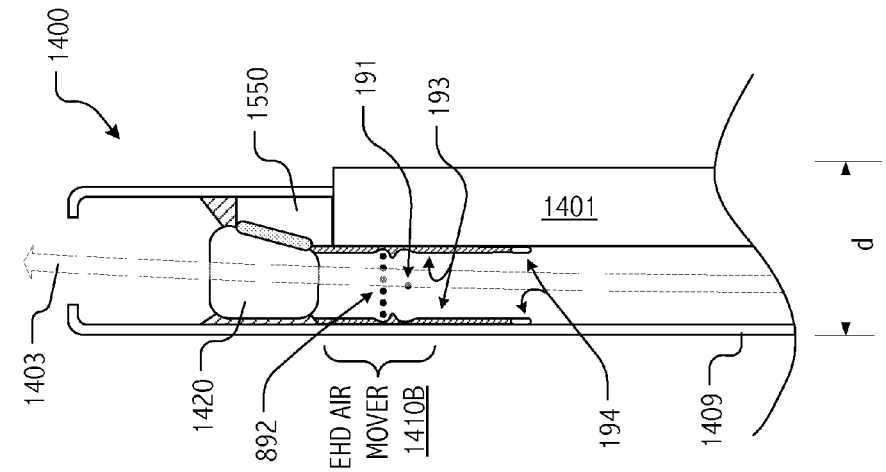
FIGS. 15B and 15C depict, in illustrative cross-sections of the flat panel display device, EHD air movers designs respectively in accord with designs illustrated in FIGS. 3 and 11, each integrated within a flat panel display-type, consumer electronics device.
Figure 15B:
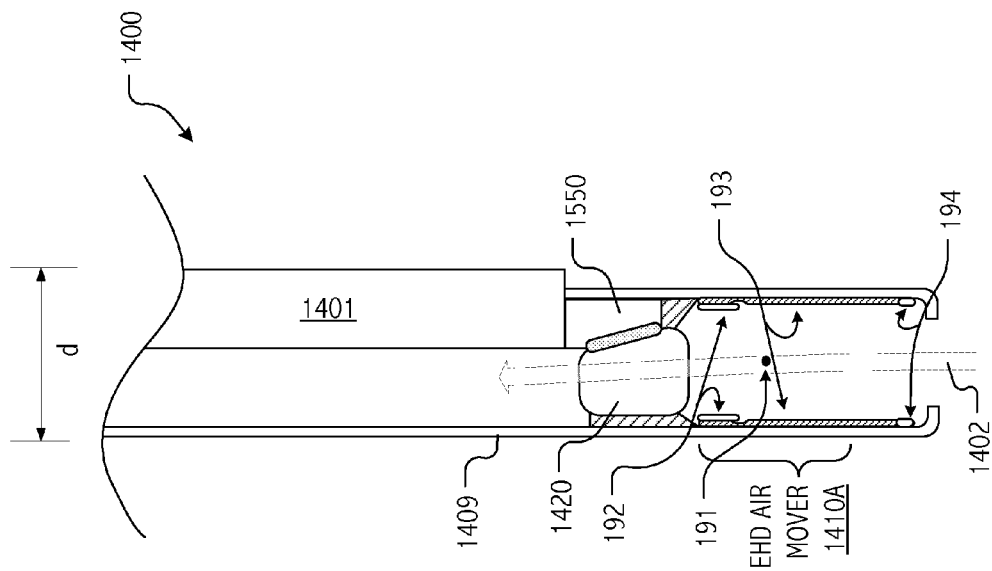

FIGS. 15B and 15C, illustrate (by way of cross-section) EHD air mover configurations for lower and upper portions of display device 1400. As before, in some cases, at least one of the electrostatically operative portions of an EHD air mover is formed as, or on, an interior surface of the enclosure itself. In some cases, at least one of the electrostatically operative portions is formed as, or on, a surface of an EMI shield that overlays an electronics assembly such as a keyboard assembly or circuit board. Also as before, such designs are described in greater detail in previously incorporated U.S. patent application Ser. No. 13/105,343, filed May 11, 2011. In any case, EHD air mover designs such as described hereinabove can be accommodated within very limited interior spaces of display device 1400 or analogously limited interior spaces of all-in-one or pad-type computing devices, smart phones, media players, book readers, etc.

Turning then illustratively to flat panel display device 1400, total depth d of cross-sections 15B and 15C, may be less than about 10 mm. Recalling the perspective view of FIG. 15A and the upper and lower instances of EHD air movers depicted therein, FIG. 15B illustrates cross-section 15B in which a substantial entirety of the interior depth accommodates an instance of lower EHD air mover 1410A. FIG. 15C likewise illustrates cross-section 15C in which display surface 1401 and an instance of upper EHD air mover 1410B are both accommodated within the depth of flat panel display device 1400. In the illustrated bottom-to-top air flow, instances of upper EHD air mover 1410B are accommodated in a volume behind display surface 1401 and, accordingly, are more tightly packed than analogous features of lower EHD air mover 1410A. For purposes of illustration and without limitation, EHD air mover 1410A has been illustrated generally in accord with EHD air mover embodiment of FIG. 3. Consistent with the more tightly packed, cross-sections illustrated in FIG. 15C, EHD air mover 1410B has been illustrated generally in accord with EHD air mover embodiment of FIG. 11.

Of course, the laptop-type and display-type consumer electronics device embodiments described above are merely illustrative. Indeed, based on the present description, persons of ordinary skill in the art will appreciate these and other device exploitations of inventive concepts of the present inventions including variations and/or adaptations appropriate for particular form factors, electronic assembly types and placements, thermal challenges and/or industrial design factors that pertain to a given design.

Other Embodiments

While the techniques and implementations of the EHD devices discussed herein have been described with reference to exemplary embodiments, it will be understood by those skilled in the art that various changes may be made and equivalents may be substituted for elements thereof without departing from the scope of the appended claims. For example, while operative embodiments have been described herein with respect to a particular illustrative power supply voltage configuration in which emitter electrodes are coupled to high positive voltage, field shaping dielectric surfaces accumulate positive charge, and collector electrodes are coupled to ground, it will be appreciated by skilled artisans having access to the present disclosure that other configurations are also possible. Grounded emitter embodiments are contemplated, as are embodiments in which voltages coupled to emitter and collector electrodes straddle a ground potential. Correspondingly, negative charge accumulation on field shaping dielectric surfaces is also contemplated. In general, any of a variety of power supply configurations may be employed consistent with the teachings herein.

While field shaping features, including berms and trenches have been described relative to top and bottom channel walls parallel to a longitudinal extent of emitter and collector electrodes, it will be apparent to persons of ordinary skill in the art having benefit of the present disclosure that similar field shaping features may and, in some cases, should be provided on sidewall surfaces. Based on the description herein skilled artisans will appreciate suitable placements of like field shaping features closely proximate locations where electrodes abut or pass through channel side walls.

In addition, many modifications may be made to adapt a particular situation or material to the teachings without departing from the essential scope thereof. Therefore, the particular embodiments, implementations and techniques disclosed herein, some of which indicate the best mode contemplated for carrying out these embodiments, implementations and techniques, are not intended to limit the scope of the appended claims.

What is claimed is:

1. An electrohydrodynamic (EHD) fluid mover apparatus energizable to motivate fluid flow, the EHD fluid mover comprising:
   an elongate emitter electrode positioned in a channel at least partially defined by generally opposing surfaces that span at least a substantial portion of a longitudinal extent of the emitter electrode and that extend generally upstream thereof; and a pair of collector electrodes, each spanning at least a substantial portion of a longitudinal extent of the emitter electrode and each having a leading edge relative to the fluid flow, the leading edges positioned downstream of the emitter electrode but each proximate to a respective one of the generally opposing surfaces, the generally opposing surfaces each formed of material suitable for accumulating, over a substantial portion thereof, electrostatic charge conveyed from the emitter electrode and each including a field shaping feature proximate to the leading edges of the respective collector electrode.

2. The apparatus of claim 1,
wherein each collector electrode of the pair is positioned against and in contact with a respective one of the generally opposing surfaces, and
wherein the field shaping feature includes a trench formed in a respective one of the generally opposing surface at a position that coincides with the leading edge of the respective collector electrode, defining an air gap between the leading edge and material of the generally opposing surface.

3. The apparatus of claim 2,
wherein each collector electrode of the pair exhibits an elongate shape extending downstream along a respective one of the generally opposing surfaces.

4. The apparatus of claim 2,
wherein the generally opposing surfaces are each formed of dielectric material.

5. The apparatus of claim 2,
wherein the generally opposing surfaces are each faced with one or more segments of conductive material electrically isolated from each other and from signal or power conveying conduction paths and ground.

6. The apparatus of claim 2,
wherein the generally opposing surfaces are each faced with dielectric tape or film.

7. The apparatus of claim 2, further comprising:
berms each formed in or on a respective one of the generally opposing surfaces at a position just upstream of the leading edge of the respective collector electrode.

8. The apparatus of claim 1,
wherein the field shaping feature includes a berm formed on a respective one of the generally opposing surfaces at a position just upstream of, and extending along the substantial entirety of, the leading edge of the respective collector electrode.

9. The apparatus of claim 8,
wherein the berm intrudes into the channel and facilitates localized charge accumulation that, during operation of the EHD fluid mover, diverts ion current around a portion of the generally opposing surface most closely proximate the leading edge of a respective collector electrode.

10. The apparatus of claim 8, wherein the berm is formed of, or faced with, one or more of:
dielectric material; and
conductive material electrically isolated from signal or power conveying conduction paths and ground.

11. The apparatus of claim 1,
wherein the field shaping feature includes a trench formed in a respective one of the generally opposing surface at a position that coincides with the leading edge of the respective collector electrode and extends along the respective generally opposing surface at least as far upstream as the elongate emitter electrode.

12. The apparatus of claim 1, further comprising:
additional collector electrodes positioned, together with the pair of collector electrodes, to define an array thereof extending generally across the channel from one of the generally opposing surfaces to the other.

13. The apparatus of claim 12,
wherein the field shaping feature includes a trench formed in a respective one of the generally opposing surfaces that provides an air gap between a particular collector electrode of the pair most closely proximate the respective generally opposing surface.

14. The apparatus of claim 12,
wherein the defined array is a generally linear array.

15. The apparatus of claim 12,
wherein the defined array presents a generally concave profile to ion flux from the elongate emitter electrode.

16. The apparatus of claim 1,
wherein the field shaping feature includes a material transition wherein material immediately proximate to the leading edge of a respective collector electrode is conductive but generally resistive to current flow.

17. The apparatus of claim 16,
wherein the collector electrodes and the generally resistive transition material are coupled to a same or substantially equivalent power supply voltage terminal, and
wherein resistance along a path from the generally resistive transition material to the same or substantially similar power supply voltage terminal substantially exceeds that from the collector electrodes.

18. The apparatus of claim 16,
wherein electrical characteristics of the transition material vary in the dimension of the fluid flow.

19. The apparatus of claim 18,
wherein the transition material presents a generally less resistive conductive path proximate the leading edges of the respective collector electrodes; and
wherein the transition material presents a generally more resistive conductive path at increasing upstream distance from the leading edges of the respective collector electrodes.

20. A method of operating electrohydrodynamic (EHD) fluid mover apparatus, the method comprising:
energizing an elongate emitter electrode to motivate fluid flow, the elongate emitter electrode positioned upstream of a pair of collector electrodes in a channel at least partially defined by generally opposing surfaces that span at least a substantial portion of a longitudinal extent of the emitter electrode and that extend at least from the collector electrodes generally upstream thereof past the elongate emitter electrode;
accumulating over a substantial portion of the generally opposing surfaces electrostatic charge conveyed from the emitter electrode; and
shaping electric field proximate to leading edges of the respective collector electrode using at least a portion of the accumulated electrostatic charge.

21. The method of claim 19, further comprising:
accumulating a localized concentration of the electrostatic charge at a berm formed in a respective one of the opposing surfaces,
wherein the electric field shaping diverts ion flow away from a portion of the respective opposing surface most closely proximate a respective collector electrode of the pair.

22. The method of claim 19, further comprising:
distributing ion flux from the elongate emitter wire over an array of collector electrodes including the pair, the array positioned to extend generally across the channel from one of the generally opposing surfaces to the other.

23. A method of making an electronic device product that includes an electrohydrodynamic (EHD) air mover to motivate airflow therethrough, the method comprising:

forming generally opposing surfaces of material suitable for accumulating, over a substantial portion thereof, electrostatic charge conveyed from an elongate emitter electrode;

positioning the emitter electrode in a channel at least partially defined by the generally opposing surfaces, the generally opposing surfaces spanning least a substantial portion of a longitudinal extent of the emitter electrode and extending generally upstream thereof; and positioning a pair of collector electrodes, each spanning at least a substantial portion of a longitudinal extent of the emitter electrode and each having a leading edge relative to the fluid flow, the leading edges positioned downstream of the emitter electrode but each proximate to a respective one of the generally opposing surfaces, wherein the formed generally opposing surfaces each include a field shaping feature formed therein or thereon proximate to the leading edges of the respective collector electrode.

24. The method of claim 23, wherein the material suitable for accumulating electrostatic charge is a dielectric material, and wherein the field shaping feature is formed of the dielectric material.

25. The method of claim 23, further comprising:

facing the generally opposing surfaces with one or more segments of conductive material electrically isolated from each other and from signal or power conveying conduction paths and ground.

26. The method of claim 23, further comprising:

facing the generally opposing surfaces with dielectric film or tape.

27. The method of claim 23, wherein the forming includes forming a berm-type field shaping feature in or on the generally opposing surfaces.

28. The method of claim 23, wherein the forming includes forming a trench-type field shaping feature in or on the generally opposing surfaces.

* * * * *